United States Patent [19]

Itoh et al.

[11] 4,451,745
[45] May 29, 1984

[54] ADDRESS BUFFER CIRCUIT WITH LOW POWER CONSUMPTION

[75] Inventors: Hideo Itoh; Kenji Agatsuma, both of Kawasaki, Japan

[73] Assignee: Fujitsu Limited, Kawasaki, Japan

[21] Appl. No.: 214,205

[22] Filed: Dec. 8, 1980

[30] Foreign Application Priority Data

Dec. 19, 1979 [JP] Japan .................. 54-165232

[51] Int. Cl.³ .................. H03K 19/092; H03K 17/687
[52] U.S. Cl. .................. 307/475; 307/481; 307/583; 307/270
[58] Field of Search .................. 307/296 A, 475, 571, 307/297, 230, 270, 530, 483, 583, 481

[56] References Cited

U.S. PATENT DOCUMENTS

| | | | |
|---|---|---|---|
| 3,859,637 | 1/1975 | Platt et al. | 307/238 |
| 4,074,148 | 2/1978 | Sato | 307/270 |
| 4,124,806 | 11/1978 | Rusznyak | 307/296 A |
| 4,146,802 | 3/1979 | Moench | 307/475 |
| 4,288,706 | 9/1981 | Reese et al. | 307/296 A |
| 4,344,003 | 8/1982 | Harmon et al. | 307/296 A |

FOREIGN PATENT DOCUMENTS 2733514  2/1978  Fed. Rep. of Germany .

Primary Examiner—Stanley D. Miller
Assistant Examiner—B. P. Davis
Attorney, Agent, or Firm—Staas & Halsey

[57] ABSTRACT

In a latch-type address buffer circuit for use in a clock-synchronous CMIS.RAM, a transistor is connected between an inverter, which is supplied with an address signal and the power source. A clock circuit is provided for generating an internal clock signal by which only in the period of latching the input address signal, the transistor is turned ON to make the inverter operative, thus reducing the total power consumption.

4 Claims, 10 Drawing Figures

ADDRESS BUFFER CIRCUIT WITH LOW POWER CONSUMPTION

BACKGROUND OF THE INVENTION

1. Field of the Invention

The present invention relates to an address buffer circuit which is suitable for use with a CMIS.RAM (Complementary Metal Insulator Semiconductor Random Access Memory).

2. Description of the Prior Art

It is common practice to operate a CMIS.RAM in synchronism with a clock signal.

FIG. 1 is a circuit diagram illustrating the principal part of a conventional address buffer circuit. Reference numeral 1 indicates a p-channel transistor; 2 designates an n-channel transistor; 3 identifies a latch circuit; $\bar{\phi}$ and $\phi$ denote internal clock signals; Ain represents an input address signal; A and $\bar{A}$ show output address signals; and $V_D$ refers to a power source voltage. This circuit is shown for one bit of the input address signal. After application of the input address signal Ain to gates of the transistors 1 and 2, the internal clock signals $\bar{\phi}$ and $\phi$ are provided to the latch circuit 3, by which the input address signal is latched in the latch circuit 3, and the output address signals A and $\bar{A}$ are outputted.

FIG. 2 illustrates a circuit for deriving the internal clock signals $\phi$ and $\bar{\phi}$ from a chip enable signal $\overline{CE}$ corresponding to an external clock signal, which circuit comprises p-channel transistors Q1, Q3, Q5 and Q7 and n-channel transistors Q2, Q4, Q6 and Q8.

FIG. 3 illustrates a detail circuit diagram for the circuit of FIG. 1. Transistors Q11 and Q12 correspond to the transistors 1 and 2 in FIG. 1; transistors Q13 and Q22 constitute the latch circuit 3 in FIG. 1; and transistors Q23 to Q26 constitute address signal output circuits. To gates of the transistors Q15 and Q20 of the latch circuit is applied the internal clock signal $\phi$ generated by the circuit of FIG. 2 and to gates of the transistors Q16 and Q19 of the latch circuit is applied the internal clock signal $\bar{\phi}$. Regarding transistors Q11 to Q26, odd-numbered and even-numbered suffixes corresond to p-channel and n-channel transistors, respectively.

It is one of features of the CMIS.RAM that power consumption while in its static state is less than several tens of microamperes. This is because no DC current path is formed other than leakage. This presents a problem, however, when guaranteeing proper operation at a TTL (Transistor-Transistor Logic) compatible input levels where a maximum low level value and a minimum high level value of the input signal level are determined to be 0.8 V and 2.2 V, respectively. That is, in the inverter formed by the transistors 1 and 2 (Q11 and Q12) which are supplied with the address signal Ain, an input signal Vin and a current Iin bear such a relationship as shown in FIG. 4. Since threshold levels Vth(n) and Vth(p) of the p-channel transistor 1 and n-channel transistor 2 are respectively set to about 1 V and about $-1$ V, the current Iin becomes large when the input signal level is within the range of Vth(n) to $V_D - |Vth(p)|$. Especially when the input signal level is Vih(min) (a minimum value of the high level), a current of several hundreds of microamperes flows. For example, in the case of a 4K-bit RAM, its total power consumption amounts to several milliamperes, seriously impairing the merits of the CMIS structure. To prevent such an increase in the power consumption, it is necessary to select the input signal level within the ranges of 0 to Vth(n) and $V_D - |Vth(p)|$ to $V_D$. However, such limitations on the input signal level are very disadvantageous in practical use.

FIG. 5 is explanatory of the operation of the prior art circuit shown in FIG. 1. When the chip enable signal $\overline{CE}$ lowers from the high level to the low level, the internal clock signals $\phi$ and $\bar{\phi}$ respectively become high-level and low-level after a predetermined period of time. Since the input address signal Ain is already valid at this time, the address signal is latched by the internal clock signals $\phi$ and $\bar{\phi}$ and the output signals A and $\bar{A}$ become valid. The current I of the address buffer circuit increases at the moment of the input address signal Ain changing from INVALID TO VALID and slightly increases at the moment of the input address signal Ain changing from VALID to INVALID but, at the other moments, remains at a certain value Iin dependent on the level of the input address signal Ain.

SUMMARY OF THE INVENTION

It is an object of the present invention to provide an address buffer circuit having low power consumption.

Another object of the present invention is to provide an address buffer circuit which is adapted so that only when latching an input address signal, an inverter at the input stage operates and, after the latching, held out of operation, thereby cutting power consumption.

Briefly stated, according to the present invention, a transistor is connected between an inverter to which an address signal is applied, and the power source, and a clock circuit is provided which generates an internal clock signal for turning ON the transistor only in the period of latching the input address signal.

DESCRIPTION OF THE PREFERRED EMBODIMENTS

Figure 6:
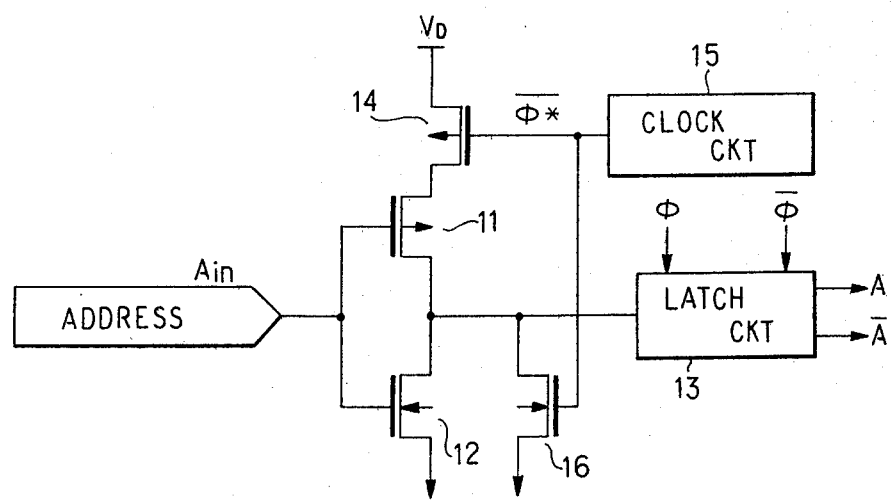
FIG. 6 is a circuit buffer illustrating the principal part of an embodiment of the present invention.

FIG. 6 illustrates the principal part of an embodiment of the present invention, which is shown for one bit of the input address signal Ain. A p-channel transistor 14 is connected between an inverter of the input stage which is composed of a p-channel transistor 11 and an n-channel transistor 12 and the power supply voltage. An internal clock signal $\phi^*$ from a clock circuit 15 is applied to the gate of the transistor 14 to turn it On only while the input address signal Ain is latched by the internal clock signals $\phi$ and $\bar{\phi}$ in a latch circuit 13. Upon turning ON the transistor 14, the power source voltage $V_D$ is supplied to the inverter to put it into operation and an output signal from the inverter, being the inversion of the input address signal Ain, is applied to the latch circuit 13, where this inverted signal is latched in response to the internal clock signals $\phi$ and $\bar{\phi}$ and from which the output address signals A and $\bar{A}$ are derived.

An n-channel transistor 16 is connected in parallel with the transistor 12 of the inverter and the internal clock signal $\bar{\phi}^*$ from the clock circuit 15 is applied to the gate of the transistor 16 to turn it OFF or ON depending on whether the transistor 14 is in the ON or OFF state respectively. Accordingly, while in the standby state until the input address signal Ain becomes valid, the internal clock signal $\bar{\phi}^*$ remains at a high-level thus holding the transistor 14 in the OFF state and the transistor 16 in the ON state. Consequently, even if the input address signal Ain undergoes a change, no current flows in the inverter. When the input address signal Ain becomes valid and the internal clock signal $\bar{\phi}^*$ becomes a low-level, the transistor 14 is turned ON and the transistor 16 is turned OFF making the inverter operative, and applying its output signal to the latch circuit 13.

Figure 7:
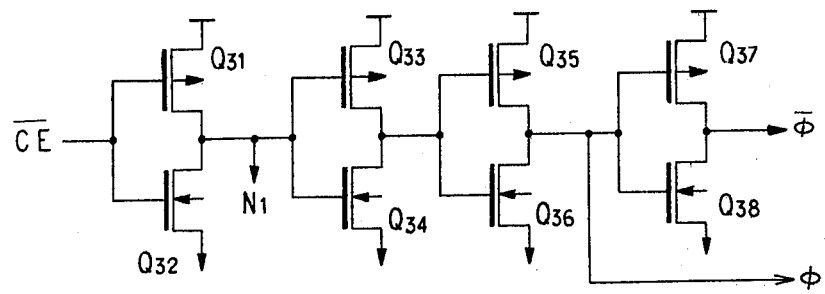
FIG. 7 is a circuit diagram illustrating an internal clock signal generator used in the embodiment of the present invention.
Figure 8:
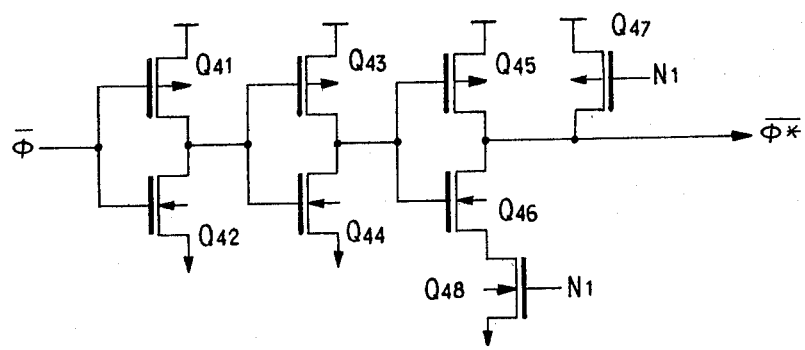
FIG. 8 is a circuit diagram illustrating a clock circuit utilized in the embodiment of the present invention.
Figure 9:
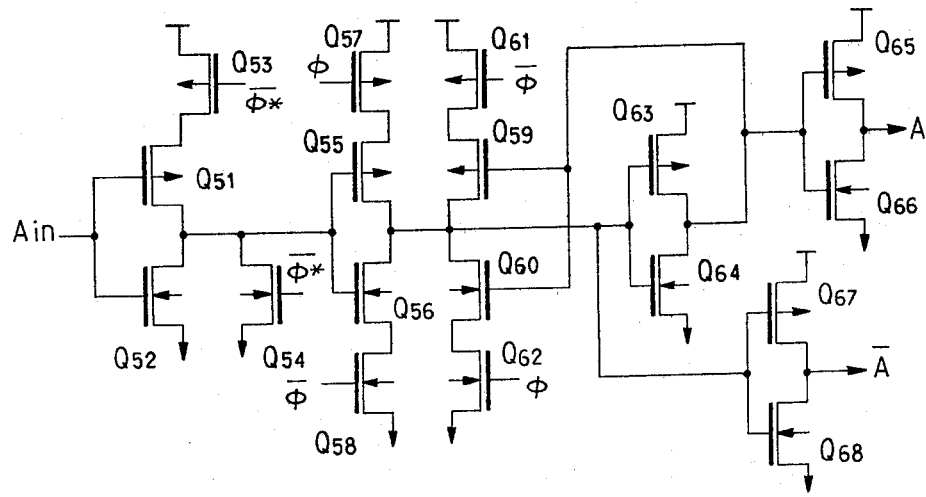
FIG. 9 is a circuit diagram illustrating in detail the embodiment of the present invention.

FIG. 7 illustrates a circuit for deriving the internal clock signals $\phi$ and $\bar{\phi}$ from the chip enable signal $\overline{CE}$ corresponding to an external clock signal; FIG. 8 illustrates a clock circuit for obtaining the internal clock signal $\bar{\phi}^*$ from the internal clock signal $\bar{\phi}$ and an output signal N1 from an inverter at the first stage of the circuit shown in FIG. 7; and FIG. 9 illustrates the inverter of the input stage and the latch circuit of FIG. 6. Reference characters Q31 to Q38, Q41 to Q48 and Q51 to Q68 indicate transistors, the odd numbered suffixes identifying p-channel transistors and the even-numbered suffixes n-channel transistors.

Figure 1:
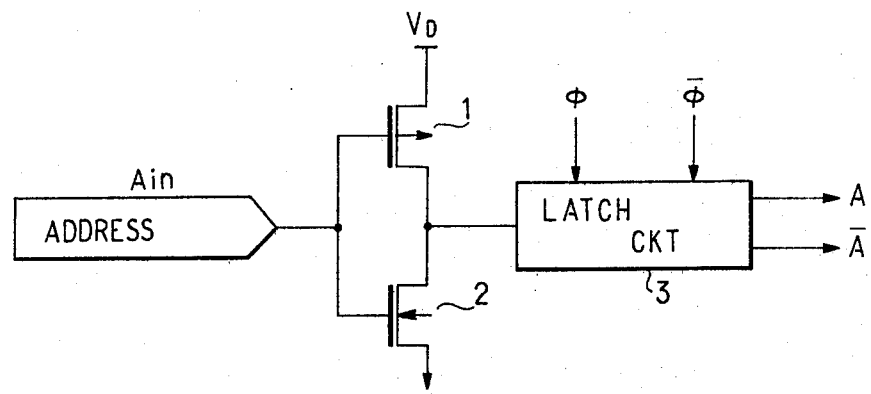
FIG. 1 is a circuit diagram illustrating the principal part of a conventional address buffer circuit.
Figure 2:
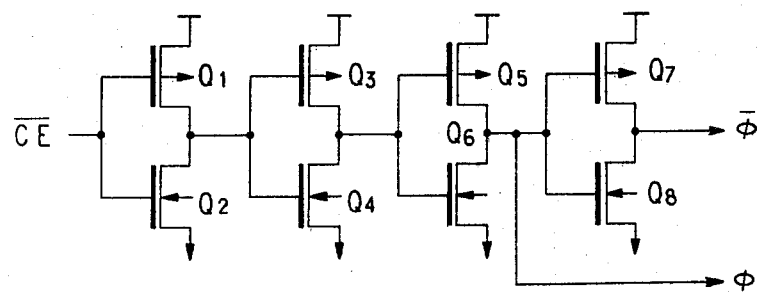
FIG. 2 is a circuit diagram illustrating a conventional internal clock signal generator.
Figure 3:
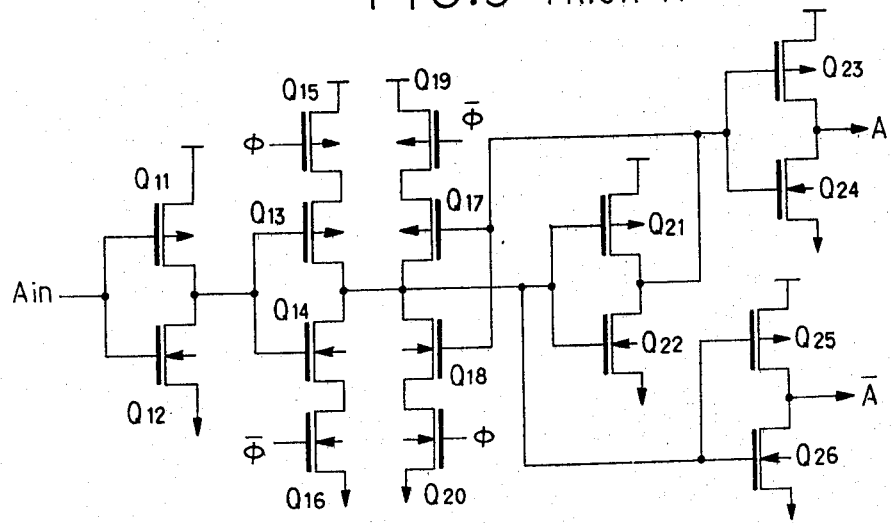
FIG. 3 is a detail circuit diagram for the circuit of FIG. 1.
Figure 4:
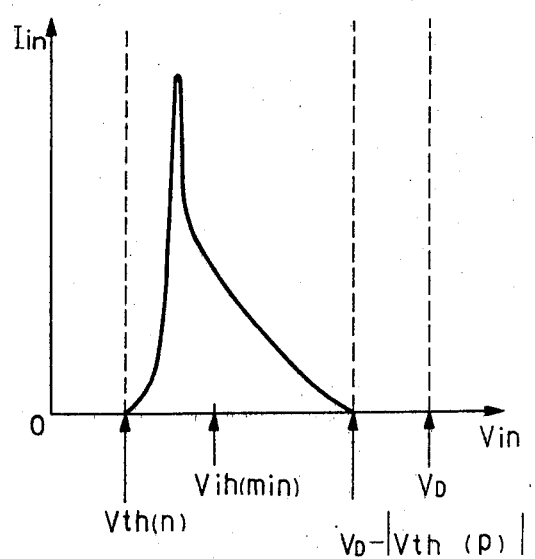
FIG. 4 is a graph showing the relationships between the input signal level and a current in an inverter.
Figure 5:
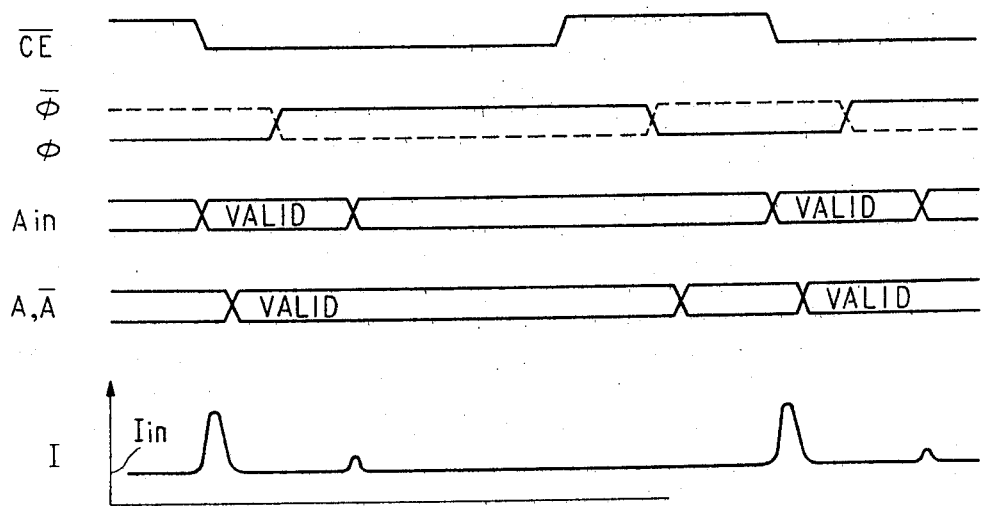
FIG. 5 is a timing chart explanatory of the operation of the prior art address buffer circuit.

The circuit of FIG. 7 is identical in construction with the prior art circuit shown in FIG. 2, but the output signal N1 from the inverter of the first stage comprising the transistors Q31 and Q32 is applied to the clock circuit.

FIG. 8 shows a detailed circuit arrangement of the clock circuit 15 of FIG. 6. The two stages of inverters formed by the transistors Q41 to Q44 comprise a delay circuit; the number of stages of inverters can also be increased. The internal clock signal $\bar{\phi}^*$ is derived from the internal clock signal $\bar{\phi}$ and the output signal N1 from the first-stage inverter of the FIG. 7 circuit.

In the circuit of FIG. 9, the transistors Q51 and Q52 comprise an input-stage inverter corresponding to the transistors 11 and 12 in FIG. 6, and the transistors Q53 and Q54 respectively correspond to the transistors 14 and 16 in FIG. 6. Further, the transistors Q57 to Q64 constitute the latch circuit 13 of FIG. 6 and the transistors Q65 to Q68 form an output circuit, from which the address signals A and $\bar{A}$ are provided.

Figure 10:
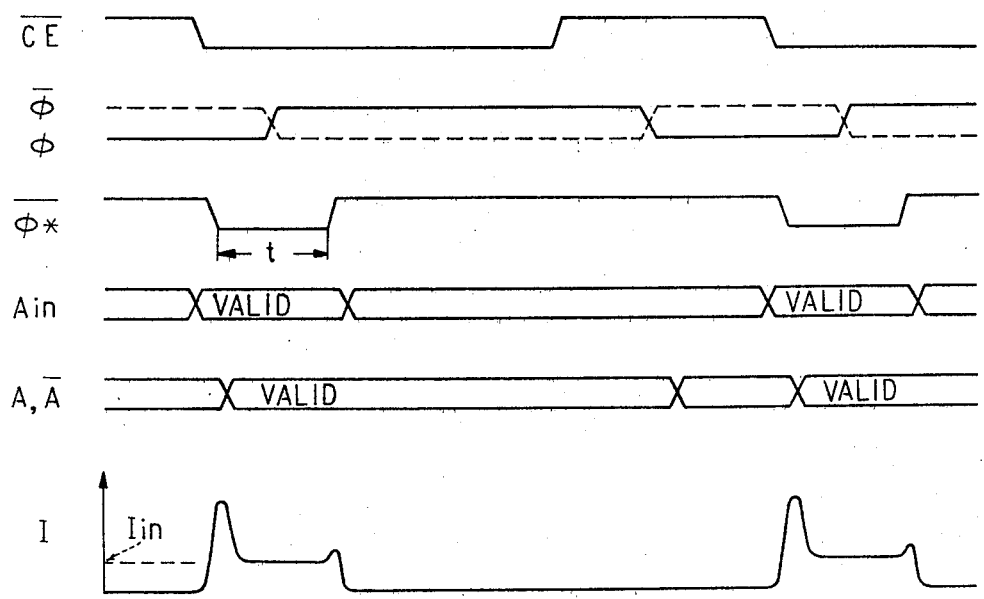
FIG. 10 is a timing chart illustrating the operation of the embodiment of the present invention.

FIG. 10 is a timing chart explanatory of the operation of the present invention. When the chip enable signal $\overline{CE}$ drops from the high level to the low level, the output signal N1 from the first-stage inverter to FIG. 7 becomes a high-level, by which the transistors Q47 and Q48 in FIG. 8 are respectively altered to the OFF and ON state. At this time, since the internal clock signal $\bar{\phi}$ is still a high-level, the transistor Q45 is in the OFF state and the transistor Q46 in the ON state and the internal clock signal $\bar{\phi}^*$ becomes a low-level. After the lapse of a predetermined period of time, the internal clock signal $\bar{\phi}$ becomes a low-level. Thus, the transistor Q45 is turned ON and the transistor Q46 is turned OFF after a delay time which is determind by the two stages of inverters formed by the transistors Q41 to Q44. Thus, the internal clock siggnal $\bar{\phi}^*$ becomes a low-level only for a period t and thereafter becomes a high-level.

The period t is selected to be within the period during which the input address signal Ain remains valid. When the internal clock signal $\bar{\phi}^*$ becomes high-level after latching the input address signal Ain in the latch of FIG. 9 circuit, the inverter of the input stage (Q51, Q52) becomes inoperative and thus even if the input address signal Ain changes, no current flows in the inverter, as described previously. The output address signals A and $\bar{A}$ from the latch circuit remain valid until the internal clock signals $\phi$ and $\bar{\phi}$ change. As a consequence, the current I flows only in the period t during which the internal clock signal $\phi^*$ is low-level and in the other periods the current I is zero, as shown in FIG. 10.

The conductivity of the channel of each transistor in the above embodiment can also be reversed by selecting the polarity of the internal clock signal.

As described in the foregoing, according to the present invention, in the address buffer circuit of the synchronous CMIS.RAM the inverter of the input stage is operative only during the operation of latching an input address signal and is held inoperative otherwise, thereby power consumption is cut in the standby state while the input address signal is invalid. Accordingly, it is possible to make full use of the merit of the CMIS.-RAM that is, its power consumption is small.

It will be apparent that many modifications and variations may be effected without departing from the scope of the novel concept of the present invention.

What is claimed is:

1. An address buffer circuit including:
   an inverter having an input for receiving an address signal, an output for providing an inversion signal being the inverted received address signal and a power source terminal for receiving power from a power source;
   a transistor connected in series between the power source terminal of the power source and having a gate electrode;
   a clock circuit, operatively connected to the gate electrode, for generating a first internal clock signal for turning ON the transistor only in a first time period and for generating a second internal clock signal at least during the first time period;
   a latch circuit operatively connected to the output of the inverter for latching the inversion signal in response to said second internal clock signal.

2. An address buffer circuit according to claim 1 wherein the clock circuit comprises:
   a transistor which operates on a signal inverted from an external clock signal to invert an output signal;
   a plurality of stages of inverters for delaying the second internal clock signal for the latch circuit, derived from the external clock signal; and
   a transistor for inverting the inverted output signal from the transistor by the output signal from the inverter.

3. An address buffer circuit including:
   an inverter having an input for receiving an address signal, an output for providing an inversion signal being the inverted received address signal and a power source terminal for receiving power from a power source;

a first transistor connected in series between the power source terminal of the inverter and the power source and having a gate electrode;

a second transistor connected between the output terminal of the inverter and ground and having a gate electrode;

a clock circuit operatively connected to the gate electrodes of the first and second transistors, for generating a first internal clock signal, for turning ON the first transistor and for turning OFF the second transistor, only in a first time period and for generating a second internal clock signal at least during the first time period;

a latch circuit operatively connected to the output of the inverter for latching the inversion signal in response to said second internal clock signal.

4. An address buffer circuit according to claim 3, wherein the clock circuit comprises:

an inverter operatively connected to receive an external clock signal, for providing a first output signal;

first cascade connected inverter stages, one of said first cascade stages operatively connected to receive said first output signal, and at least one other of said first cascade stages providing as an output, said second internal clock signal;

second cascade connected inverter stages for providing the first internal clock signal, one of said second cascade stages operatively connected to receive said second internal clock signal;

a third transistor operatively connected between the output of the last stage of said second cascade stages and the power source, the third transistor being operatively connected to and controlled by said first output signal;

a fourth transistor operatively connected in series between the last stage of said second cascade stages and ground, the third transistor being operatively connected to and controlled by said first output signal.

* * * * *

UNITED STATES PATENT AND TRADEMARK OFFICE
CERTIFICATE OF CORRECTION

PATENT NO. : 4,451,745

DATED : May 29, 1984

INVENTOR(S) : ITOH ET AL.

It is certified that error appears in the above-identified patent and that said Letters Patent is hereby corrected as shown below:

Column 1, line 17, "$\bar{\phi}$" should be --$\phi$--;
line 18, "$\phi$" should be --$\bar{\phi}$--;
line 23, "$\bar{\phi}$" should be --$\phi$--;
line 24, "$\phi$" should be --$\bar{\phi}$--.
Column 2, line 48, "buffer" should be --diagram--.
Column 3, line 3, "and $\phi$" should be --and $\bar{\phi}$--;
line 9, "and $\phi$" should be --and $\bar{\phi}$--;
line 63, "to" should be --in--.
Column 4, line 7, "siggnal" should be --signal--;
line 12, after "latch" insert --circuit--;
line 13, delete "circuit";
line 20, "$\phi*$" should be --$\bar{\phi}*$--.

Signed and Sealed this

Twentieth Day of November 1984

[SEAL]

Attest:

GERALD J. MOSSINGHOFF

Attesting Officer

Commissioner of Patents and Trademarks

UNITED STATES PATENT AND TRADEMARK OFFICE
CERTIFICATE OF CORRECTION

PATENT NO. : 4,451,745

DATED : May 29, 1984

INVENTOR(S) : Itoh et al.

It is certified that error appears in the above-indentified patent and that said Letters Patent is hereby corrected as shown below:

Column 4, line 45, (claim 1) "of" should be --and--.

Signed and Sealed this

Thirty-first Day of December, 1996

Attest:

BRUCE LEHMAN

*Attesting Officer*     *Commissioner of Patents and Trademarks*